United States Patent [19]
D'Anna et al.

[11] Patent Number: 5,949,104
[45] Date of Patent: Sep. 7, 1999

[54] SOURCE CONNECTION STRUCTURE FOR LATERAL RF MOS DEVICES

[75] Inventors: Pablo Eugenio D'Anna, Los Altos; Joseph Herbert Johnson, Sunnyvale, both of Calif.

[73] Assignee: Xemod, Inc., Sunnyvale, Calif.

[21] Appl. No.: 09/020,257

[22] Filed: Feb. 7, 1998

[51] Int. Cl.[6] .................... H01L 29/423; H01L 29/43; H01L 29/739
[52] U.S. Cl. .................. 257/335; 257/382; 257/383; 257/384; 257/343
[58] Field of Search ................... 257/335, 382, 257/383, 384, 901, 276, 340, 343

[56] References Cited

U.S. PATENT DOCUMENTS

| | | |
|---|---|---|
| 4,682,405 | 7/1987 | Blanchard et al. ............... 438/274 |
| 5,155,563 | 10/1992 | Davies et al. ..................... 257/327 |
| 5,548,150 | 8/1996 | Omura et al. ..................... 257/349 |
| 5,841,166 | 11/1998 | D'Anna et al. ................... 257/335 |

*Primary Examiner*—John Guay
*Attorney, Agent, or Firm*—Boris G. Tankhilevich

[57] ABSTRACT

A source connection structure for a lateral RF MOS device is disclosed. The connection structure utilizes a conductive plug to connect a source area and a body area of the device with a backside. The usage of a conductive plug eliminates at least one doping area used for connectivity purposes. Therefore, the density of RF MOS devices per unit area of the chip is increased.

9 Claims, 3 Drawing Sheets

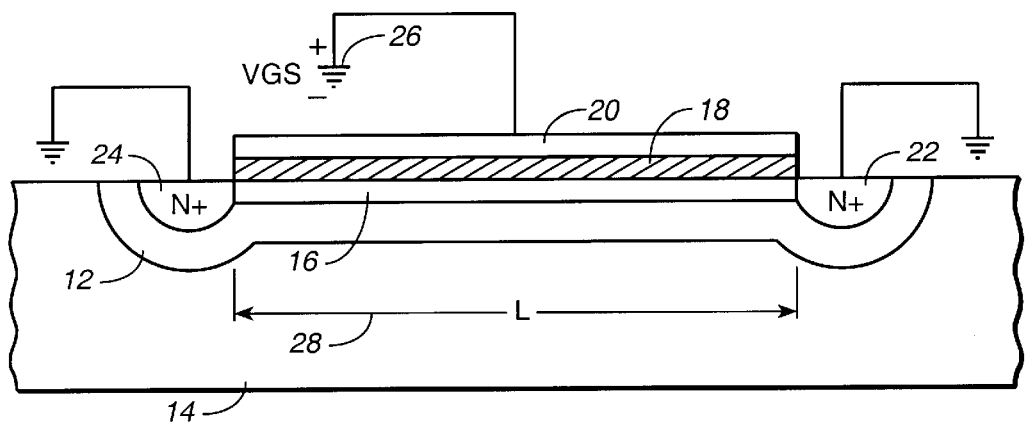
FIG._1A
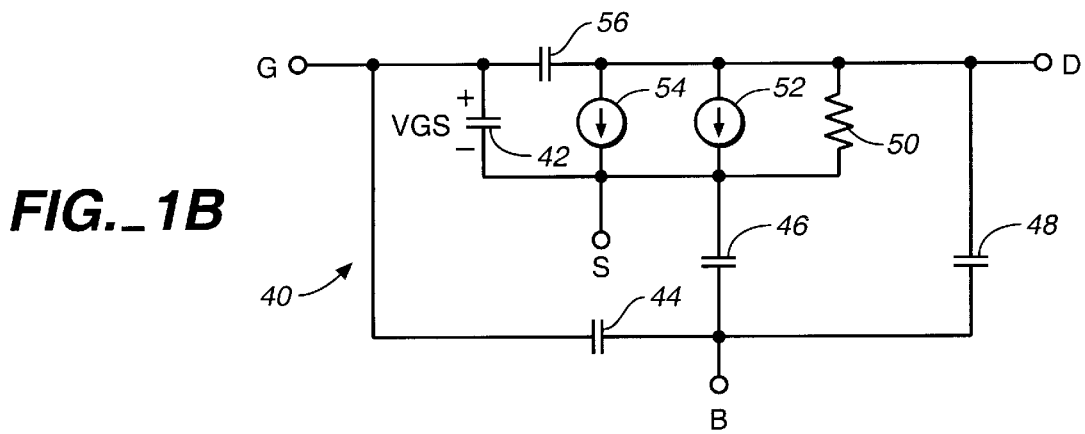
FIG._1B
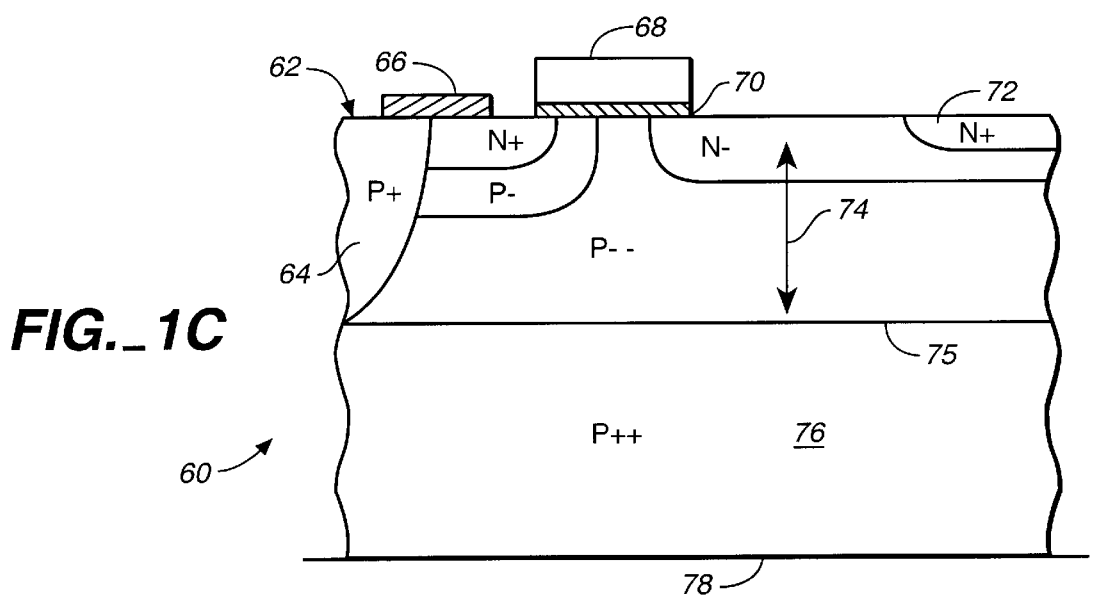
FIG._1C

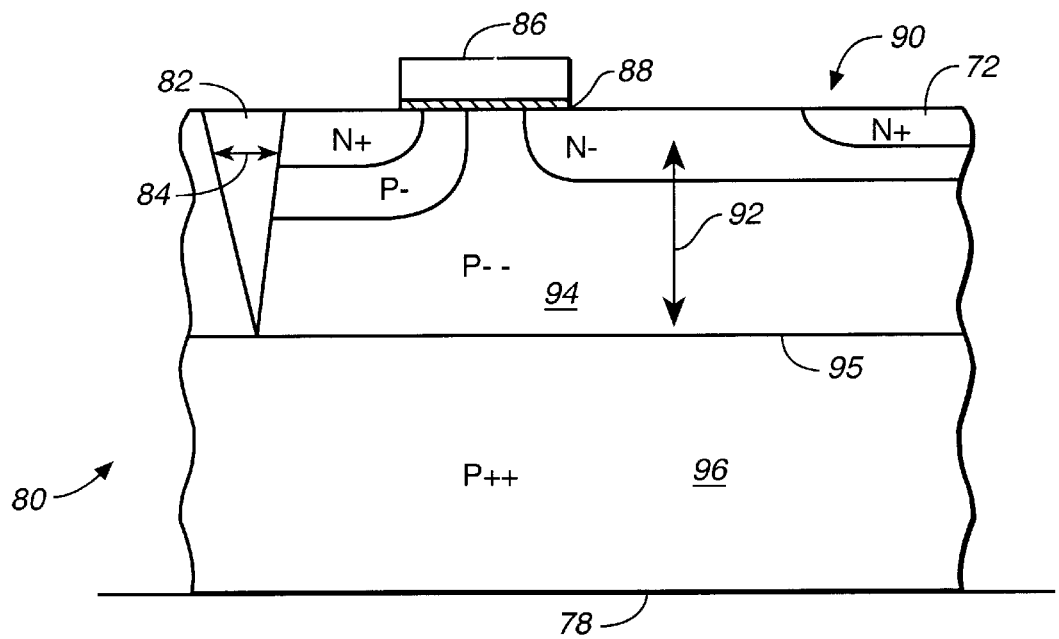
FIG._1D
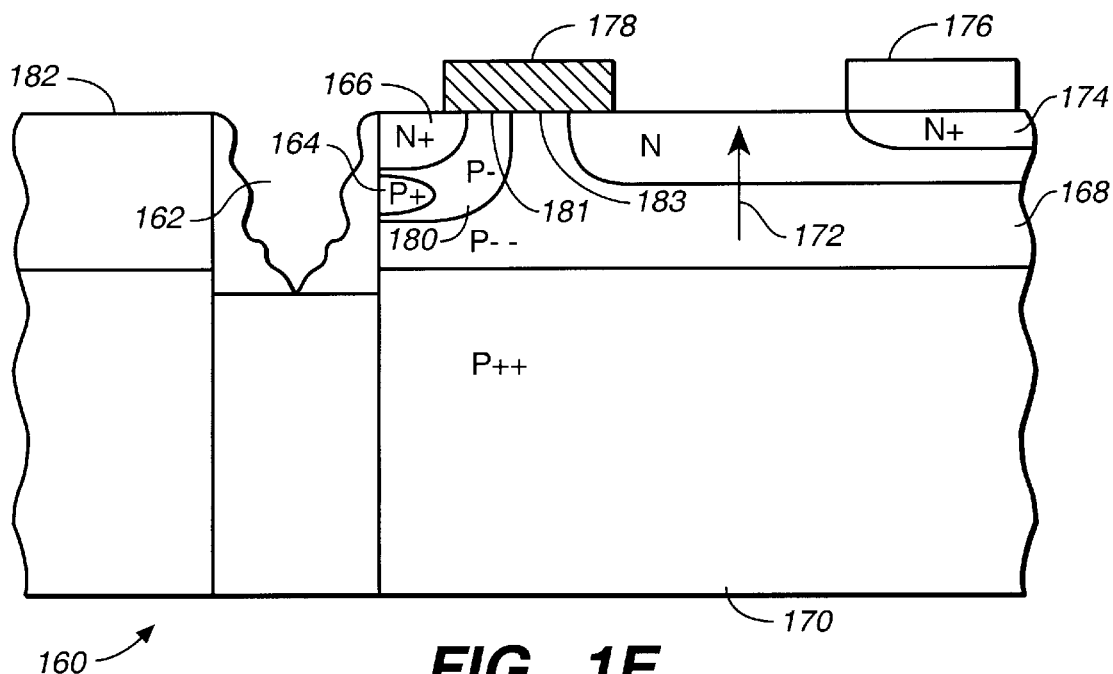
FIG._1E

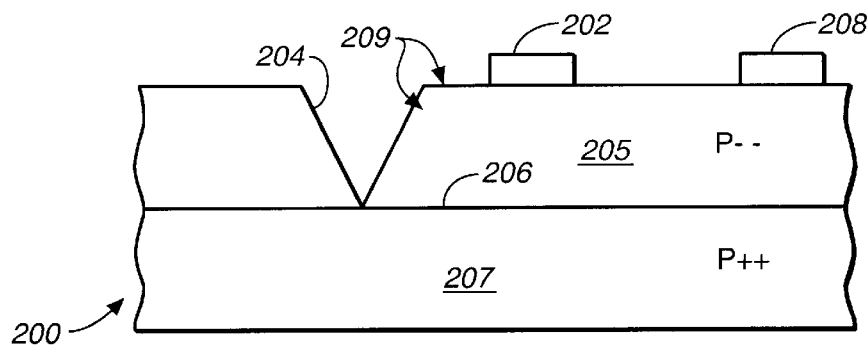
FIG._2
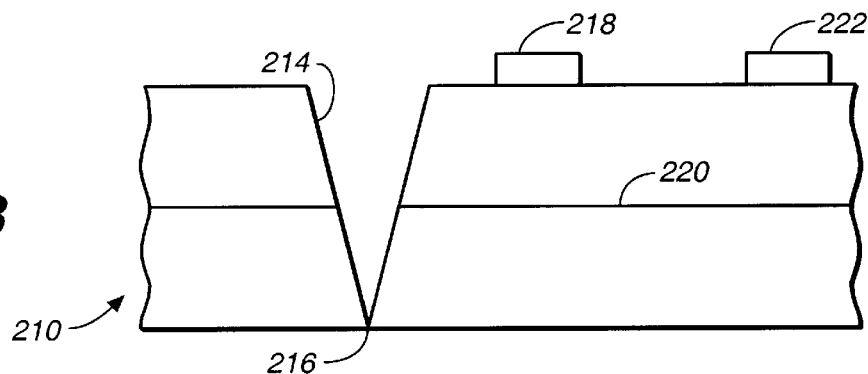
FIG._3
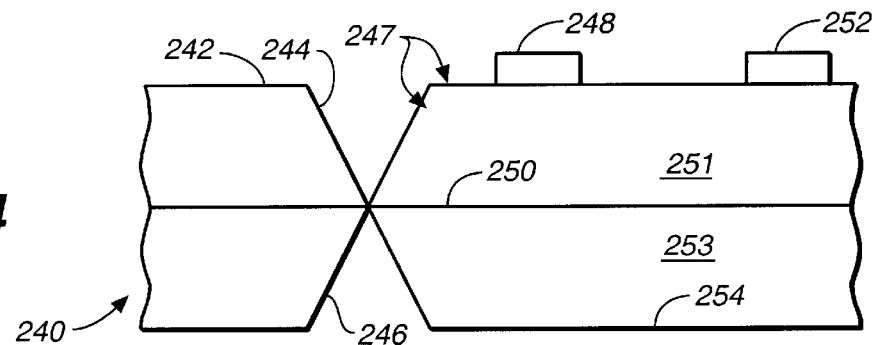
FIG._4
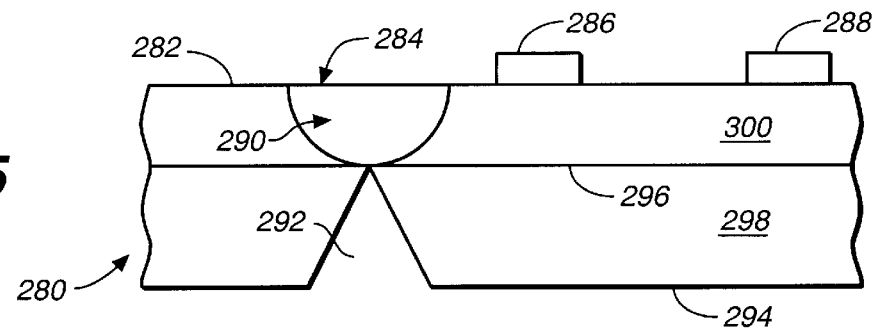
FIG._5

SOURCE CONNECTION STRUCTURE FOR LATERAL RF MOS DEVICES

BACKGROUND

Power high frequency devices have been built using a variety of semiconductor technologies. For a long time the preferred vehicle for their realization has been the NPN bipolar junction transistor (BJT). Its primary advantage was the achievable high intrinsic transconductance ($g_m$) that permitted the fabrication of high power devices utilizing small silicon areas.

As processing technology improved, in the early 1970's a number of MOSFET vertical structures begun to challenge the dominance of the BJT at the lower RF frequencies, trading the cost of the large silicon area, necessary to provide the current capability in MOSFETs, for the cost of simple processing. The advantages that the MOSFET structure provided to the user were: higher power gain, ruggedness (defined as the capacity to withstand transients) and ease of biasing.

In the continuous quest for high frequency operation at high power the MOSFET structure has displaced the BJT since the early 1970's in applications where its performance has been competitive.

Recently, new prior art RF MOS devices have been placed on the market by several vendors. The new prior art RF MOS devices utilize the standard lateral MOS device with a diffused via that connects the source to the backside of the chip such that the back side becomes both electrical and thermal ground. The prior art structure also uses a polysilicide gate process as a compromise between the fabrication benefits of the self aligned polysilicon gate and the high frequency performance of the metal gate structure. The prior art structure has extended the frequency of operation of MOS devices into the 2 GHz region thus covering two frequency bands of great commercial importance: the cellular and PCS/PCN mobile telephone bands.

The via backside contact design and the polysilicide gate processing technology have allowed the prior art device to attain its performance. Firstly, by transferring the source connection to the backside of the chip through a diffused via, the packaging of the device has been simplified reducing parasitic inductance and resistance to ground. The thermal dissipation has been also improved because an electrical isolation layer in the package has been removed. Secondly, the output capacitance of RF MOS device for the common-source mode of amplification operation has been made comparable to the output capacitance obtained with BJT structures. This results in improved collector efficiency and in wider usable bandwidth (BW) of the RF MOS device operating as an amplifier. This improvement comes about as the lateral RF MOS device at high drain-source applied bias has a lower drain-source capacitance ($C_{ds}$) than the drain-source capacitance of the prior art RF MOS devices. Finally, the use of polysilicide allows the efficient feeding of long gate fingers.

What is needed is to further improve the design of the existing lateral RF MOS devices. This can be done by improving the connection from the source to the backside of the silicon substrate with a metal plug thus reducing the space needed for that connection. In the fabrication of the existing RF MOS devices, source to backside via diffusion moves laterally as well as downward, wherein a metal plug can be made deep and narrow. The metal plug design would allow inclusion of more usable device active area per unit chip area, increase of available device output power per unity chip area, further decrement of the minimal value of the drain-source capacitance ($C_{ds}$), and in wider usable BW of the device operating as an amplifier.

SUMMARY

The present invention is unique because it allows one to obtain an increase in the packing density of the RF MOS device active areas per unit chip area, a reduction in the output capacitance of the RF MOS device, and an improvement in usable BW of the RF MOS device employed in amplifier circuits.

One aspect of the present invention is directed to a lateral MOS structure having a plug connecting the source region at the chip surface to its backside.

In the first preferred embodiment, the lateral MOS structure comprises a semiconductor material of a P-type having a first dopant concentration $P^{--}$ and a top surface. An enhanced drain drift region of an N conductivity type having a dopant concentration N is formed completely within the semiconductor material. A drain region of an N conductivity type having a dopant concentration N+ is formed in the semiconductor material. The conductive gate structure is insulated from the top surface of the semiconductor material by an oxide portion, which in turn overlies the N enhanced region. The N enhanced region extends between the N drain region and the conductive gate. A body region of P conductivity type is formed in the semiconductor material in the opposite side of the gate structure. The body region has a dopant concentration P that is equal or greater than the first dopant concentration $P^{--}$. The body region includes a first end underlying the conductive gate structure. The remaining portion of the semiconductor material of the first conductivity type P underlies the gate structure. A fourth region of the second conductivity type N is formed in the semiconductor material. The fourth region is located within the body region. The fourth region forms the source region of the MOS structure. A fifth region of the first conductivity type P is also formed in the semiconductor material. The fifth region having a dopant concentration $P^+$ forms a body region contact enhancement in the source region of the MOS structure. The dopant concentration of the fifth region $P^+$ is greater than the dopant concentration P of the body region. The fifth region is located within the body region. Finally, a conductive plug region is formed in the source region of the semiconductor material.

In one embodiment of the first preferred embodiment of the connecting structure, the conductive plug region connects the source region and the body region of the semiconductor material to the backside of the MOS structure.

In another embodiment of the first preferred embodiment of the connecting structure, the conductive plug region connects a surface of the source region and a lateral surface of the body region of the semiconductor material to a highly conductive substrate of the lateral MOS structure.

In the second preferred embodiment, the lateral MOS structure comprises a semiconductor material of a P-type having a first dopant concentration $P^{--}$ and a top surface. An enhanced drain drift region of an N conductivity type having a dopant concentration N is formed completely within the semiconductor material. A drain region of an N conductivity type having a dopant concentration $N^+$ is formed in the semiconductor material. The conductive gate is insulated from the top surface of the semiconductor material by an oxide portion, which in turn overlies the N enhanced region. The N enhanced region extends between the N drain region and the conductive gate. A body region of P conductivity type is formed in semiconductor material of the lateral MOS structure. The body region has a dopant concentration P that is equal or greater than the first dopant concentration $P^{--}$. The body region includes a first end underlying the conductive gate. The remaining portion of the semiconductor material of the first conductivity type P underlies the gate. A fourth region of the second conductivity type N is formed in the semiconductor material. The fourth region is located within the body region. The fourth region forms a source region of the lateral MOS structure. A fifth region of the first conductivity type P is also formed in the semiconductor material. The fifth region having a dopant concentration $P^+$ forms a body contact enhancement region of the lateral MOS structure. The dopant concentration of the fifth region P+ is greater than the dopant concentration P of the body region. The fifth region is located within the body region.

In the second preferred embodiment, a sixth region of the first conductivity type P is additionally formed in the semiconductor material. The sixth region having a dopant concentration $P^+$ forms a contact region of the lateral MOS structure. The sixth region contacts the body region to a highly conductive substrate of the lateral MOS structure. Finally, a conductive plug region is formed in the semiconductor material. The conductive plug region connects a backside of the semiconductor material to the sixth region of the lateral MOS structure.

In one embodiment of the lateral MOS structure, the dopant concentration $N^+$ of the fourth region is equal to the dopant concentration $N^+$ of the drain region.

The conductive plug can comprise: a metal plug, or a silicided plug. The silicided metal plug can comprise: a tungsten silicided plug, a titanium silicided plug, a cobalt silicided plug, or a platinum silicided plug.

BRIEF DESCRIPTION OF THE DRAWINGS

FIG. 1A shows an idealized NMOS device cross section with depletion and induced channel and with applied positive $V_{GS}$.

FIG. 1B is a small-signal MOS transistor equivalent circuit.

FIG. 1C is an illustration of the prior art structure of lateral RF MOS devices.

FIG. 1D depicts a lateral view of a simplified plug contact structure of a lateral RF MOS transistor.

FIG. 1E depicts a detailed lateral view of the plug contact structure of a lateral RF MOS transistor.

FIG. 2 illustrates a lateral view of a plug contact structure, wherein the conductive plug region connects a top surface and a lateral surface of the source region of the semiconductor material to a highly conductive substrate of the MOS structure.

FIG. 3 is a lateral view of the MOS structure, wherein a V-shaped conductive plug region connects a top surface and a lateral surface of the source region of the semiconductor material to a backside of the MOS structure.

FIG. 4 depicts a lateral view of the MOS structure, wherein an X-shaped conductive plug region connects a top surface and a lateral surface of the source region of the semiconductor material to a backside of the MOS structure.

FIG. 5 is a lateral view of the MOS structure, wherein the conductive plug region connects a backside of the semiconductor material to the diffusionally formed source region of the MOS structure.

DETAILED DESCRIPTION OF THE PREFERRED EMBODIMENTS

An idealized NMOS device cross section with depletion and induced channel and with applied positive $V_{GS}$ is shown in FIG. 1A. For the complete reference, please, see "Analysis and Design of Analog Integrated Circuits" by Paul Gray and Robert Meyer, published by John Wiley & Sons, Inc., 1993.

In the large-signal model of a typical NMOS device, we consider substrate, source, and drain grounded and a positive voltage $V_{GS}$ (between the gate (20) and the substrate (14)) applied to the gate as shown in FIG. 1A. The gate and the substrate form the plates of a capacitor with the layer of silicon oxide ($SiO_2$) (18) as a dielectric. Positive charge accumulates on the gate and negative charge in the substrate. Initially, the negative charge in the P-type substrate is manifested by creation of a depletion region (12) and resulting exclusion of holes under the gate. The depletion-layer width X under the oxide is:

$$X \ (2\epsilon\phi/qN_A)^{1/2}; \quad (1)$$

where $\phi$ is the potential in the depletion layer at the oxide-silicon interface, $N_A$ (atoms/cm³) is the doping density (assumed constant) of the p-type substrate, and $\epsilon$ is the permittivity of the silicon. The charge per unit area in this depletion region is $$Q = qN_AX = \sqrt{(2qN_A\epsilon\phi)}. \quad (2)$$

When the potential in the silicon reaches a critical value equal to twice the Fermi level $\phi_f \sim 0.3$ V, a phenomena known as "inversion" occurs. Further increases in gate voltage produce no further changes in the depletion-layer width but instead a thin layer of electrons is induced in the depletion layer directly under the oxide. This produces a continuous n-type region (16) with the source (24) and drain (22) regions and is the conducting channel between source and drain. The channel (16) can be modulated by increases or decreases in the gate voltage. In the presence of an inversion layer, and with no substrate bias, the depletion region contains a fixed charge:

$$Q_{b0} = \sqrt{(2qN_A\epsilon\phi_f)}. \quad (3)$$

If a substrate bias voltage $V_{SB}$ (source is positive for n-channel devices) is applied between source and substrate, the potential required to produce inversion becomes ($2\phi_f + V_{SB}$) and the charge stored in the depletion region in general is:

$$Q_b = \sqrt{(2qN_A\epsilon(2\phi_f + V_{SB}))}. \quad (4)$$

The gate voltage $V_{GS}$, required to produce an inversion layer, is called the threshold voltage $V_t$ and can be calculated as follows. This voltage consists of several components. First, a voltage $[2\phi_f + (Q_b/C_{Ox})]$ is required to sustain the depletion layer charge $Q_b$, where $C_{Ox}$ is the gate oxide capacitance per unit area. Second, a work-function difference $\phi_{ms}$ exists between the gate metal and the silicon. Third, there is always charge density $Q_{SS}$ (positive) in the oxide at the silicon interface. This is caused by crystal discontinuities at the Si—$SiO_2$ interface and must be compensated by a gate voltage contribution of (−) $Q_{SS}/C_{Ox}$. Thus, we have a threshold voltage:

$$V_t = \phi_{ms} + 2\phi_f + (Q_b/C_{Ox}) - Q_{SS}/C_{Ox} \quad (5)$$

$$= V_{t0} + \gamma\left(\sqrt{2\phi_f + V_{SB}} - \sqrt{2\phi_f}\right);$$

where $\gamma = (1/C_{Ox})\sqrt{2qN_A\epsilon}$, $C_{Ox} = \epsilon_{Ox}/t_{Ox}$, and $\epsilon_{Ox}$ and $t_{Ox}$ are the permittivity and thickness of the oxide, respectively.

The preceding large-signal equations can be used to derive the small-signal model of the MOS transistor in the saturation or pinch-off region. The source-substrate voltage $V_{BS}$ affects threshold voltage $V_t$ (eq. 5) and thus the drain current $I_D$. This is due to influence of the substrate acting as a second gate and is called body effect. As a consequence, the drain current $I_D$ is a function of both $V_{GS}$ and $V_{BS}$, and two transconductance generators (54) and (52) are needed in the small-signal model (40) as shown in FIG. 1B. Variations in voltage $V_{bs}$ from source to body cause current $g_{mb}V_{bs}$ to flow from drain to source. The substrate of this idealized lateral MOS device is the area that we call "body region" in the lateral RF MOS device and is always connected to the most negative supply voltage and is thus an ac ground. Thus, in the present embodiments the "body" effect has no role.

Parasitic resistances due to the channel contact regions should be included in series with the source and drain of the model. These resistances have an inverse dependence on channel width W and have typical values of 50 to 100 Ω for devices with W of about 1 $\mu$.

The parameters of the small signal model (40) of FIG. 1B can be determined from the I–V characteristics of the NMOS device. For voltages between drain and substrate $V_{DS}$ low in comparison with the Early voltage $V_A$, the transconductance $g_m$ is:

$$g_m = \sqrt{2k'(W/L)I_D}; \quad (6)$$

where $k' = \mu_n C_{Ox}$, $\mu_n$ is the average electron mobility in the channel, L and W are the length and the width of the channel. Thus, like the JFET and unlike the bipolar transistor, the transconductance of the MOS depends on both bias current and the W/L ratio (and also on the oxide thickness via k').

Similarly, the transconductance $g_{mb}$ (52) can be expressed as follows:

$$g_{mb} = [\gamma \sqrt{2k'(W/L)I_D}/(\sqrt{2(2\phi_f + V_{SB})})]. \quad (7)$$

The small-signal output resistance $r_0$ (50) can be expressed as follows:

$$r_0 \, (\partial I_D/\partial V_{DS})^{-1} = (V_A/I_D). \quad (8)$$

The gate-source capacitance $C_{gs}$ (42) of FIG. 1B is intrinsic to the device operation in the saturation region. On the other hand, the substrate-source capacitance $C_{sb}$ (46) is shorted by a metal finger in the prior art device or by the source plug in the present invention structure, and the drain-source capacitance $C_{db}$ (48) is a parasitic depletion-region capacitance equal to the drain-source $C_{ds}$ capacitance. Therefore, for the lateral RF MOS structure:

$$C_{sb} = 0; \quad (9)$$

and $$C_{db} = C_{db0}/(\sqrt{(1+V_{DB}/\phi_0)}) = C_{ds0}/(\sqrt{(1+V_{DB}/\phi_0)}) = C_{ds}. \quad (10)$$

The high frequency gain of the lateral RF MOS device is controlled by the capacitance elements in the equivalent circuit. The frequency capability of the lateral RF MOS device is most often specified in practice by determining the frequency where the magnitude of the short-circuit, common gate current gain falls to unity. This is called the transition frequency, $f_T$, and is a measure of the maximum useful frequency of the transistor when it is used as an amplifier. The $f_T$ of the lateral RF MOS is given by:

$$f_T = (1/2\pi) g_m/(C_{gs} + C_{gd}). \quad (11)$$

The prior art structure (60) depicted in FIG. 1C illustrates one technique to make a connection of the source and body regions in the MOS structure to the backside (78) through the diffusion of a dopant (64) introduced from the topside (62) of the chip and a metal finger short. However, this diffusion not only moves the topside dopant (64) down and sideways but also moves the substrate dopant (76) up thus reducing the distance between the highly doped substrate interface (75) and the drain area (72) of the device. This diffusion movement of the interface (75) produces an increase of the minimum source-drain capacitance $C_{ds}$ that can be obtained under a high voltage bias $V_{DS}$.

On the other hand, FIG. 1D illustrates the simplified embodiment of the plug structure (80) of the present invention. The plug (82) connects the source and the body areas to the backside (95) through the original epitaxial layer (94) thickness without diffusion. The connection area (84 of FIG. 1D) can be made small comparable to the prior art diffusion area (66 of FIG. 1C). Thus, one can increase the density of devices per inch².

The usage of a metal plug (82 of FIG. 1D) takes care of two important prior art technological problems: (1) how to make a good ohmic contact in a small area (2) without long thermal processing cycles. As it is well known in the art, the long thermal processing cycles increase the doping movements and thus, would increase the source-drain capacitance $C_{ds}$ in the present configuration.

The detailed source-body connection structure (160) for lateral RF MOS devices of the present invention is shown in FIG. 1E. The structure (160) can be used at high frequency applications, such as the cellular and the PCS regions of the RF spectrum.

As was stated above (eq. 11), the principal parameters that need to be optimized in the design of a high frequency, high power lateral RF MOS transistor are: the transconductance $g_m$ and the interelectrode capacitances $C_{gs}$, $C_{gd}$, and $C_{ds}$.

In the plug structure of the present invention, the transconductance per unit $g_m$ is increased by fabricating the device with the smallest plug size that the technology would allow.

The reduction of the interelectrode capacitance (mainly $C_{gd}$ and $C_{db}$) affects gain and efficiency. The gate-drain capacitance $C_{gd}$ (56 of FIG. 1B) and the source-drain capacitance $C_{db}$ (48 of FIG. 1B) are proportional to the gate and drain region areas (including sidewalls). Therefore, the reduction in $C_{gd}$ capacitance can be obtained by minimizing the channel length L and by minimizing the insertion of the drain extension lateral diffusion under the gate. The reduction in $C_{ds}$ capacitance can be obtained by utilizing a high resistivity material under the drain portion of the structure and by separating the drain area from the source.

FIG. 1E depicts a detailed cross-sectional view of the lateral RF MOS transistor having a plug source-body-contact structure. The device structure (160) comprises: a semiconductor material comprising an epitaxial layer (168) of a first conductivity type and having an epitaxial layer dopant concentration and a top surface (182). In one embodiment, the epitaxial layer's conductivity type is P-type, that is the majority carriers are holes. The dopant concentration of the epitaxial layer is P⁻⁻, wherein (--) indicates that the dopant concentration P⁻⁻ of holes in the epitaxial layer (168) is small comparatively with the hole concentration P in the body region (180) (see discussion below). The typical dimensions of the epitaxial layer (168) are (3–10)$\mu$.

In another embodiment of the present invention, the semiconductor material (168) is of a second N-conductivity type, has a dopant concentration $N^{--}$ and includes a top surface (182). In this embodiment, the majority carriers are electrons.

A conductive gate (178) overlies the top surface (182) of the semiconductor material. The gate (178) is insulated from the semiconductor material by a gate oxide layer (184). The gate oxide layer has the dimensions (200–700)Å. In one embodiment, the gate comprises a polysilicon gate.

The region (172) forms an enhanced drain drift region of the RF MOS structure. The region (172) is formed completely within the semiconductor material (168). The enhanced drain drift region (172) has N conductivity type (if the epitaxial layer has P conductivity type and vice versa) and has a dopant concentration N. The enhanced drain region increases the drain-to-source breakdown voltage $V_t$ of the RF MOS structure (160). The enhanced drain region (172) has dimensions (0.1–5.0)$\mu$ laterally, and about (0.2–0.5)$\mu$ vertically.

A drain region (174) is also formed in the semiconductor material (168). The drain region (174) has the N conductivity type (if the epitaxial layer has P conductivity type and vice versa). The drain region (174) has a dopant concentration $N^+$ that is greater than the dopant concentration N of the enhanced region (172). The drain region (174) contacts the enhanced region (172). The typical dimensions of the drain region (174) are (0.5–3.0)$\mu$ horizontally, and (0.1–0.3)$\mu$ it vertically.

A body region of the RF MOS structure (180 of FIG. 1E) is also formed in the semiconductor material. The body region (180) has P conductivity type (if the epitaxial layer has P conductivity type and vice versa). The body region has a dopant concentration P that is equal or greater than the dopant concentration $P^{--}$ of the epitaxial layer (168). The body region includes a subregion (181) underlying the conductive gate (178). The remaining portion (183) of the semiconductor material underlying the gate (178) is of P conductivity type (if the epitaxial layer has P conductivity type and vice versa). The typical dimensions of the body region (180) are (0.5–1.5)$\mu$ horizontally or vertically.

The body region (180) includes a source contact region (166) being of N conductivity type N (if the epitaxial layer has P conductivity type and vice versa) and having a dopant concentration $N^+$. The typical dimensions of the source contact region (166) are (0.5–1.5)$\mu$ horizontally.

The body region (180) also includes a body contact region (164) being of P conductivity type (if the epitaxial layer has P conductivity type and vice versa) and having a dopant concentration $P^+$ that is greater than the dopant concentration P of the body region (180). The typical dimensions of the region (164) are (0.5–1.0) $\mu$ vertically or horizontally.

A conductive plug region (162) is formed in the source-body region of the semiconductor material.

In one embodiment, the conductive plug region (162) connects the source region (166) and the body contact region (164) of the semiconductor material to a backside of the RF MOS structure.

In one embodiment, as depicted in FIG. 3, the conductive plug region (214) connects the top lateral surface (218) of the source region and body contact region (164) to a highly conductive substrate (216) of the RF MOS structure (210).

In another embodiment, as depicted in FIG. 2, the conductive plug region (204) connects a top of the source region and a lateral surface (209) of the body contact region to an interface (206) between a highly conductive substrate (207) of the RF MOS structure and an epitaxial layer (205).

Yet, in one more embodiment, as depicted in FIG. 4, the conductive plug region comprises two elements (244) and (246). The element (244) of the plug connects a top of the source region and a lateral surface (247) of the body contact region to an interface (250) between a highly conductive substrate (254) of the RF MOS structure and an epitaxial layer (251). The element (246) connects the backside (254) of the substrate (253) with the interface (250) between the substrate (253) of the RF MOS structure and the epitaxial layer (251).

The conductive plug structure (160) of FIG. 1E can comprise a metal plug or a silicided plug.

The silicided plug can comprise a tungsten silicided plug, a titanium silicided plug, a cobalt silicided plug, or a platinum silicided plug.

As was stated above, the usage of a conductive plug in the lateral RF MOS transistor structure (160) of FIG. 1E allows one to make a good ohmic contact in a small area of an RF MOS device without having long thermal cycles needed in case of diffusion dopant. Thus, the usage of a conductive plug prevents the increase in the doping movements and betters the usage of the small areas of the MOS device. The better usage of small areas allows a design engineer to increase the density of the RF MOS structures that can be placed per inch$^2$.

In another embodiment of the present invention, depicted in FIG. 5, a lateral RF MOS transistor has a structure (280). The structure (280) of FIG. 5 substantially comprises the structure (160) of FIG. 1E with one important difference: the plug (164) of FIG. 1E is replaced with the plug (292) of FIG. 5 and a diffusion region (290).

Therefore, the discussion of the embodiment (280) of FIG. 5 substantially incorporates the given above discussion of the embodiment (160) of FIG. 1E.

However, the additional region (290) requires an additional discussion. The region (290) forms a conductive region of the plug structure. The region (290) has a P conductivity type if the epitaxial layer (300) has a P conductivity type, and vice versa. The region (290) has a dopant concentration that is greater than the dopant concentration of the body region of the RF MOS structure (280) (not shown). The region (290) connects the top and side surfaces (282) of the RF MOS structure (280) to an interface between the highly conductive substrate (298) and the epitaxial layer (300) of the structure (280) of FIG. 5.

The conductive plug region (292) connects a backside (294) of the substrate (298) to the region formed (290) in the semiconductor material of the RF MOS structure.

The conductive plug of the structure (280) of FIG. 5 can also comprise a metal plug or a silicided plug. The silicided plug can comprise a tungsten silicided plug, a titanium silicided plug, a cobalt silicided plug, or a platinum silicided plug.

The usage of a conductive plug (292) in the structure (280) of FIG. 5 also allows one to decrease the dopant area needed for connection of the source of the RF MOS device (284) and the backside (294). Thus, the usage of a conductive plug results in decreased doping area, in decreased doping movements, and in a better usage of the small areas of the RF MOS device. Again, as was stated above, the better usage of small areas allows a design engineer to increase the density of the RF MOS active areas that can be placed per inch$^2$.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A lateral RF MOS transistor structure having a plug connective structure comprising:

a semiconductor material of a first conductivity type, said semiconductor material having a first dopant concentration and a top surface;

a conductive gate overlying and insulated from said top surface of said semiconductor material;

a first region formed completely within said semiconductor material of said first conductivity type, said first region being of a second conductivity type and having a second dopant concentration to form an enhanced drain drift region of said RF MOS transistor structure;

a second region formed in said semiconductor material, said second region being of said second conductivity type and having a third dopant concentration greater than said second dopant concentration to form a drain region of said RF MOS transistor, said second region contacting said first region;

a third region formed in said semiconductor material, said third region being of said first conductivity type and having a fourth dopant concentration to form a body region of said RF MOS transistor structure, said fourth dopant concentration being equal or greater than said first dopant concentration, said third region having a first end underlying said conductive gate, any remaining portion of said semiconductor material underlying said gate being of said first conductivity type;

a fourth region formed in said semiconductor material, said fourth region being of said second conductivity type and having a fifth dopant concentration to form a source region of said RF MOS transistor structure, said fourth region being located within said third region;

a fifth region formed in said semiconductor material, said fifth region being of said first conductivity type and having a sixth dopant concentration to form a contact enhancement region of said RF MOS transistor structure, said sixth dopant concentration being greater than said fourth dopant concentration of said third region, said fifth region being located within said third region;

and a conductive plug region formed in said source region and said body region of said semiconductor material; wherein said conductive plug region connects said source region and said body region of said semiconductor material to a backside of said RF MOS transistor structure; and wherein said conductive plug makes direct physical contact with said backside of the structure.

2. The lateral RF MOS transistor structure of claim 1, wherein said conductive plug region connects a top or lateral surface of said source and a lateral surface of said body region of said semiconductor material to a highly conductive substrate of said structure.

3. The lateral RF MOS transistor structure of claim 1, wherein said first conductivity type is a P type.

4. The lateral RF MOS transistor structure of claim 1, wherein said conductive plug comprises a metal plug.

5. The lateral RF MOS transistor structure of claim 1, wherein said conductive plug comprises a silicided plug.

6. The lateral RF MOS transistor structure of claim 5, wherein said silicided plug comprises a tungsten silicided plug.

7. The lateral RF MOS transistor structure of claim 5, wherein said silicided plug comprises a titanium silicided plug.

8. The lateral RF MOS transistor structure of claim 5, wherein said silicided plug comprises a cobalt silicided plug.

9. The lateral RF MOS transistor structure of claim 5, wherein said silicided plug comprises a platinum silicided plug.

* * * * *